(12) United States Patent
Yun et al.

(10) Patent No.: US 11,571,783 B2
(45) Date of Patent: Feb. 7, 2023

(54) POLISHING PAD HAVING EXCELLENT AIRTIGHTNESS

(71) Applicant: SKC solmics Co., Ltd., Gyeonggi-do (KR)

(72) Inventors: Sunghoon Yun, Gyeonggi-do (KR); Jang Won Seo, Busan (KR); Jaein Ahn, Gyeonggi-do (KR); Jong Wook Yun, Gyeonggi-do (KR); Hye Young Heo, Gyeonggi-do (KR)

(73) Assignee: SKC solmics Co., Ltd., Gyeonggi-do (KR)

( * ) Notice: Subject to any disclaimer, the term of this patent is extended or adjusted under 35 U.S.C. 154(b) by 457 days.

(21) Appl. No.: 16/605,483

(22) PCT Filed: Aug. 6, 2018

(86) PCT No.: PCT/KR2018/008897
§ 371 (c)(1),
(2) Date: Oct. 15, 2019

(87) PCT Pub. No.: WO2019/031789
PCT Pub. Date: Feb. 14, 2019

(65) Prior Publication Data
US 2021/0291314 A1   Sep. 23, 2021

(30) Foreign Application Priority Data
Aug. 7, 2017 (KR) .......................... 10-2017-0099528

(51) Int. Cl.
*B24B 37/22* (2012.01)
*B24B 37/20* (2012.01)
*B24B 37/24* (2012.01)

(52) U.S. Cl.
CPC ............ *B24B 37/22* (2013.01); *B24B 37/205* (2013.01); *B24B 37/24* (2013.01)

(58) Field of Classification Search
CPC ....... B24B 37/20; B24B 37/205; B24B 37/22; B24B 37/24; B24B 37/245; B24B 37/26; B24D 18/0072; B24D 18/0009; B24D 7/12
See application file for complete search history.

(56) References Cited

U.S. PATENT DOCUMENTS

| 2004/0033758 | A1* | 2/2004 | Wiswesser | B24B 37/205 451/6 |
| 2005/0070216 | A1* | 3/2005 | Roberts | B24B 37/22 451/433 |
| 2009/0253353 | A1* | 10/2009 | Ogawa | B24B 37/205 428/218 |

(Continued)

FOREIGN PATENT DOCUMENTS

| JP | 2003-289056 | 10/2003 |
| JP | 2004-106174 | 4/2004 |
| JP | 2008-226911 | 9/2008 |

(Continued)

*Primary Examiner* — Joel D Crandall
(74) *Attorney, Agent, or Firm* — IP & T Group LLP

(57) ABSTRACT

An embodiment relates to a polishing pad which is used in a chemical mechanical planarization (CMP) process and has excellent airtightness, wherein the polishing pad is excellent in airtightness of a window opening and thus can prevent water leakage that may occur during a CMP process.

9 Claims, 2 Drawing Sheets

(56) References Cited

U.S. PATENT DOCUMENTS

2013/0324020 A1* 12/2013 Lefevre .................. B24B 37/16
 451/529
2017/0246722 A1* 8/2017 Hu .......................... B24B 37/22

FOREIGN PATENT DOCUMENTS

| JP | 2009-045694 | 3/2009 |
| KR | 10-0646887 | 11/2006 |
| KR | 10-0903473 | 6/2009 |
| KR | 10-2015-0055047 | 5/2015 |

* cited by examiner

[Fig. 1]
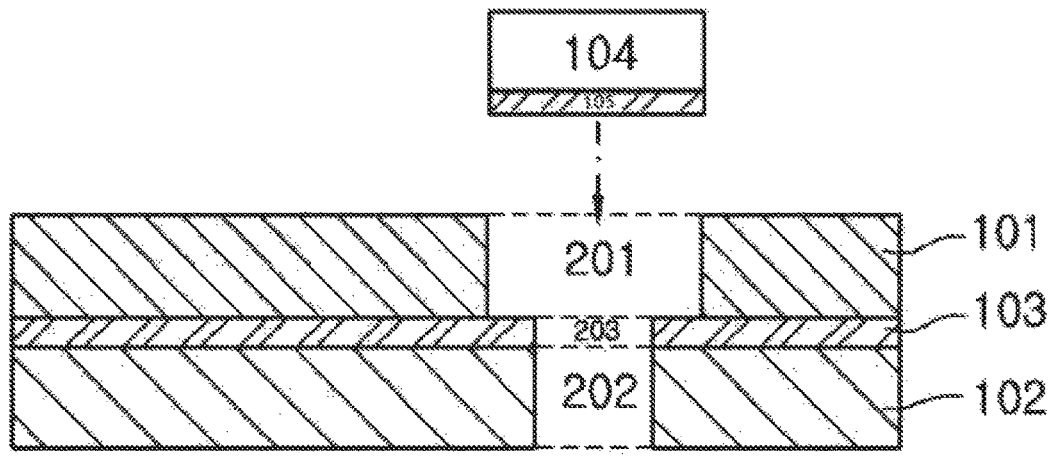
[Fig. 2]
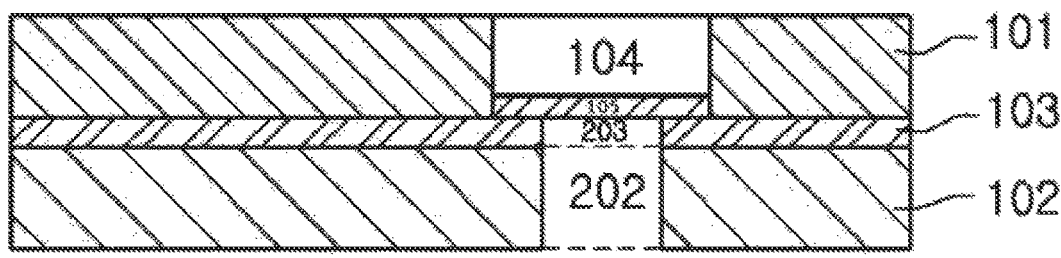
[Fig. 3]
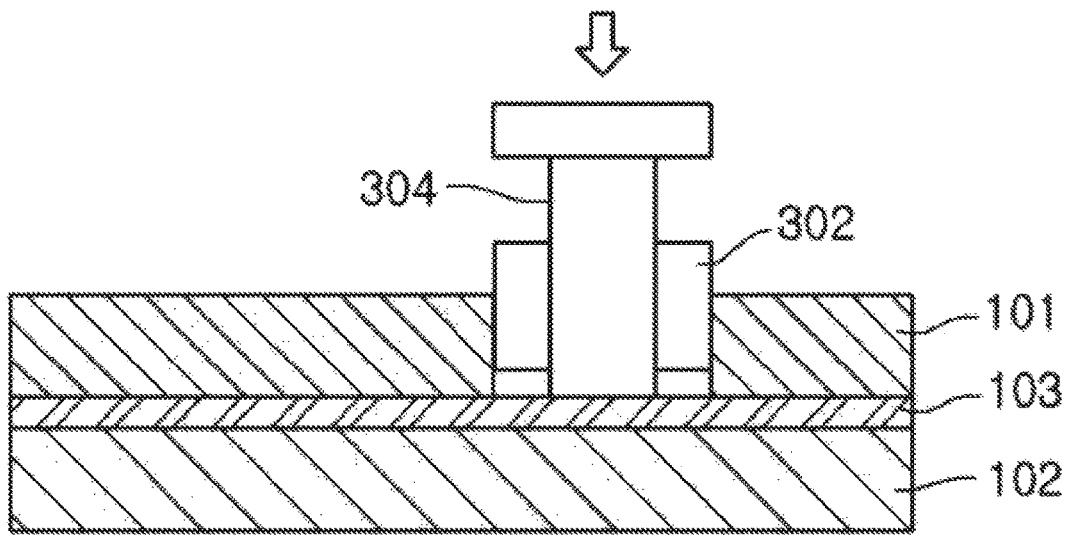

[Fig. 4]
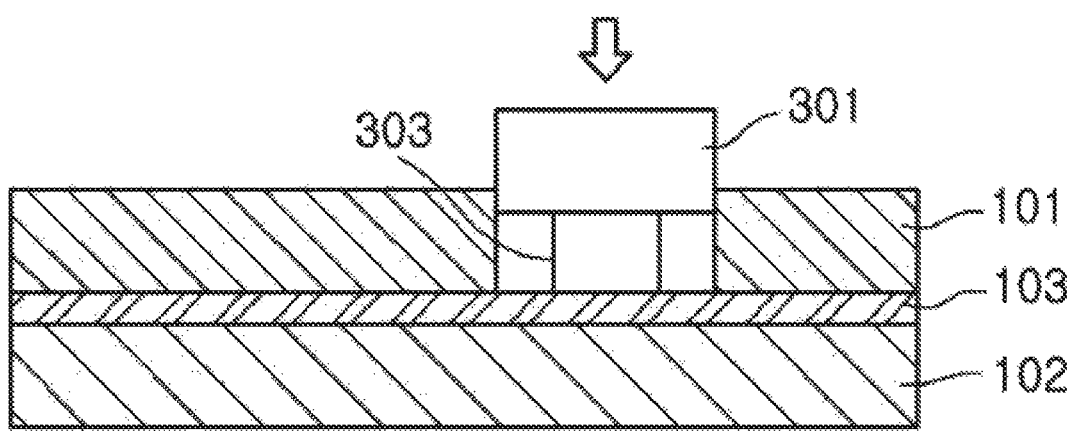

POLISHING PAD HAVING EXCELLENT AIRTIGHTNESS

This application is a national stage application of PCT/KR2018/008897 filed on Aug. 6, 2018, which claims priority of Korean patent application number 10-2017-0099528 filed on Aug. 7, 2017. The disclosure of each of the foregoing applications is incorporated herein by reference in its entirety.

TECHNICAL FIELD

Embodiments relate to a polishing pad for use in a chemical mechanical planarization (CMP) process, which has excellent gas tightness.

BACKGROUND ART

A polishing pad for a chemical mechanical planarization (CMP) is an essential element that plays an important role in the CMP process for the fabrication of semiconductors. It plays an important role in materializing the performance of the CMP process. A polishing pad for a CMP process serves to remove unnecessary portions on a wafer and makes the surface of the wafer smooth through a uniform polishing operation during the CMP process.

In recent years, various methods have been proposed to measure the thickness of a wafer and to detect the termination point of the CMP process. For example, in order to in-situ determine the flatness of the surface of a wafer, a method has been proposed in which a window is mounted in a polishing pad, and the thickness of the wafer is measured through a reflected beam generated by the interference of a laser through the window. Several methods for mounting a window in a polishing pad have been proposed. For example, there have been proposed a method of inserting and integrating a window block in the step of forming a polishing layer (hereinafter, "a window-integrated polishing pad") (see Korean Patent No. 10-0646887) and a method in which a polishing layer is punched and a window block separately prepared is inserted into the punched hole (hereinafter, "a window-inserted polishing pad") (see Korean Patent No. 10-0903473).

Meanwhile, the window-inserted polishing pad has a disadvantage in that leakage occurs during a CMP process due to the gap between the polishing layer and the window block. It is urgent to develop a polishing pad having excellent gas tightness in order to prevent leakage that may occur in a CMP process.

DISCLOSURE OF INVENTION

Technical Problem

Accordingly, an object of the embodiments is to provide a polishing pad having excellent gas tightness, so that it produces an effect of preventing leakage that may occur in a CMP process.

Solution to Problem

In order to achieve the above object, an embodiment provide a polishing pad, which comprises a polishing layer having a first penetrating hole formed therein; a support layer having a second penetrating hole formed in the region in which the first penetrating hole is formed; a first adhesive layer interposed between the polishing layer and the support layer and having a third penetrating hole formed in the region in which the first penetrating hole is formed; and a window inserted in the first penetrating hole and having a second adhesive layer adhered to a side of the window, wherein the second penetrating hole and the third penetrating hole are aligned with each other, and a part of the peripheral region of the second adhesive layer and the first adhesive layer are adhered to each other.

Another embodiment provides a process for preparing a polishing pad, which comprises (1) providing a polishing layer having a first penetrating hole formed therein; (2) providing a support layer opposite to the polishing layer; (3) interposing a first adhesive layer between the polishing layer and the support layer, and adhering the polishing layer and the support layer to each other with the adhesive layer; (4) forming a third penetrating hole passing through the first adhesive layer in a predetermined region of the first adhesive layer and a second penetrating hole passing through the support layer in a predetermined region of the support layer, based on the first penetrating hole; and (5) inserting a window having a second adhesive layer adhered to a side of the window into the first penetrating hole and adhering a part of the peripheral region of the second adhesive layer and the first adhesive layer.

Advantageous Effects of Invention

The polishing pad according to the embodiments has excellent gas tightness of the opening portion of the window, so that it produces an effect of preventing leakage that may occur in a CMP process.

BRIEF DESCRIPTION OF DRAWINGS

FIGS. 1 and 2 are cross-sectional views of a polishing pad of an embodiment.

FIGS. 3 and 4 schematically show a method of forming a second penetrating hole and a third penetrating hole according to an embodiment.

BEST MODE FOR CARRYING OUT THE INVENTION

An embodiment provides a polishing pad, which comprises a polishing layer having a first penetrating hole formed therein; a support layer having a second penetrating hole formed in the region in which the first penetrating hole is formed; a first adhesive layer interposed between the polishing layer and the support layer and having a third penetrating hole formed in the region in which the first penetrating hole is formed; and a window inserted in the first penetrating hole and having a second adhesive layer adhered to a side of the window, wherein the second penetrating hole and the third penetrating hole are aligned with each other, and a part of the peripheral region of the second adhesive layer and the first adhesive layer are adhered to each other.

Referring to FIGS. 1 and 2, the polishing pad of an embodiment comprises a polishing layer (101) having a first penetrating hole (201) formed therein; a support layer (102) having a second penetrating hole (202) formed therein; a first adhesive layer (103) interposed between the polishing layer and the support layer and having a third penetrating hole (203) formed therein; and a window (104) inserted in the first penetrating hole (201) and having a second adhesive layer (105) adhered to a side of the window.

Polishing Layer

The polishing layer has a first penetrating hole formed therein.

The polishing layer may be formed from a polishing layer composition that comprises a first urethane-based prepolymer, a curing agent, and a foaming agent.

A prepolymer generally refers to a polymer having a relatively low molecular weight wherein the degree of polymerization is adjusted to an intermediate level so as to conveniently mold a molded article to be finally produced in the process of preparing the same. A prepolymer may be molded by itself or after a reaction with another polymerizable compound. Specifically, the first urethane-based prepolymer may be prepared by reacting an isocyanate compound with a polyol and may comprise an unreacted isocyanate group (NCO).

The curing agent may be at least one of an amine compound and an alcohol compound. Specifically, the curing agent may comprise at least one compound selected from the group consisting of an aromatic amine, an aliphatic amine, an aromatic alcohol, and an aliphatic alcohol.

The foaming agent is not particularly limited as long as it is commonly used for forming voids in a polishing pad. For example, the foaming agent may be at least one selected from the group consisting of a solid foaming agent having a void, a liquid foaming agent filled with a volatile liquid, and an inert gas.

The thickness of the polishing layer is not particularly limited. For example, it may be 0.8 to 5.0 mm, 1.0 to 4.0 mm, or 1.0 to 3.0 mm.

The surface of the polishing layer may have a concave-convex structure in order to maintain and replace a slurry. In addition, the concave-convex structure generally has a regularity; however, it is possible to change the groove pitch, groove width, groove depth, and the like at specific positions for the purpose of maintaining and replacing a slurry.

The width (or diameter) of the first penetrating hole may be 10 to 100 mm.

Support Layer

The support layer has a second penetrating hole formed in the region in which the first penetrating hole is formed.

The support layer may be a polyester nonwoven fabric type impregnated with a polyurethane resin, a suede type of a polyurethane resin, a foam type of a polyurethane resin, or any combination thereof, but it is not limited thereto.

The thickness of the support layer is not particularly limited. For example, it may be 0.1 to 3.0 mm or 0.4 to 1.5 mm.

The second penetrating hole is formed in the region in which the first penetrating hole is formed. The planar area of the second penetrating hole may be smaller than the planar area of the first penetrating hole. If the planar area of the second penetrating hole is smaller than the planar area of the first penetrating hole, it is possible to effectively fix a window in the first penetrating hole since the support layer that can support the window is present at the bottom end of the first penetrating hole.

Specifically, the width (or diameter) of the second penetrating hole may be smaller than the width (or diameter) of the first penetrating hole. More specifically, the width (or diameter) of the second penetrating hole may be 5 to 95 mm.

First Adhesive Layer

The first adhesive layer has a third penetrating hole formed in the region in which the first penetrating hole is formed and is interposed between the polishing layer and the support layer.

The first adhesive layer may be formed of a hot-melt adhesive having a melting point of 90 to 130° C. Specifically, the first adhesive layer may be formed of a hot-melt adhesive having a melting point of 110 to 130° C.

The hot-melt adhesive may be at least one selected from the group consisting of a polyurethane resin, a polyester resin, an ethylene-vinyl acetate resin, a polyamide resin, and a polyolefin resin. Specifically, the hot-melt adhesive may be at least one selected from the group consisting of a polyurethane resin and a polyester resin.

If the melting point of the first adhesive layer is within the above range, the adhesive strength of the first adhesive layer is excellent, so that it is possible to prevent the polishing layer and the support layer from being easily delaminated from each other and to prevent the polishing layer or the support layer from being deformed or deteriorated.

The thickness of the first adhesive layer may be 10 to 400 µm, specifically 20 to 250 µm. If the thickness of the first adhesive layer is within the above range, it is possible for the adhesive layer to be melted at low temperatures to bond the polishing layer and the support layer to each other, and it is advantageous in that the adhesive strength is strong.

The third penetrating hole is formed in the region in which the first penetrating hole is formed. The planar area of the third penetrating hole may be smaller than the planar area of the first penetrating hole. If the planar area of the third penetrating hole is smaller than the planar area of the first penetrating hole, it is possible to effectively fix a window in the first penetrating hole since the first adhesive layer that can support the window is present at the bottom end of the first penetrating hole.

Specifically, the width (or diameter) of the third penetrating hole may be smaller than the width (or diameter) of the first penetrating hole. More specifically, the width (or diameter) of the third penetrating hole may be 5 to 95 mm.

In addition, the width (or diameter) of the third penetrating hole may be smaller than the width (or diameter) of the first penetrating hole. It may be the same as the width (or diameter) of the second penetrating hole. Specifically, the width (or diameter) of the second penetrating hole may be the same as the width (or diameter) of the third penetrating hole, which may be 10 to 95%, or 17 to 95%, of the width (or diameter) of the first penetrating hole.

The second penetrating hole and the third penetrating hole are aligned with each other. The second penetrating hole and the third penetrating hole may be formed at the same time, so that the second penetrating hole and the third penetrating hole correspond to each other.

Window

The window is inserted into the first penetrating hole and has a second adhesive layer formed on a side thereof.

The window may be formed from a window composition that comprises a second urethane-based prepolymer and a curing agent. The second urethane-based prepolymer may be prepared by reacting an isocyanate compound with a polyol and may comprise an unreacted isocyanate group (NCO).

The curing agent may be at least one of an amine compound and an alcohol compound. Specifically, the curing agent may comprise at least one compound selected from the group consisting of an aromatic amine, an aliphatic amine, an aromatic alcohol, and an aliphatic alcohol.

The window may have the same size as that of the first penetrating hole in the polishing layer. In addition, the window may have a thickness that is the same as, or smaller than, the thickness of the polishing layer. Specifically, the window may have a thickness that is smaller than the thickness of the polishing layer.

The window may be a non-foam. Since the window has no microbubbles therein, it is possible to reduce the possibility for a polishing liquid to penetrate into the polishing pad, resulting in improvements in the accuracy of optically detecting the termination point and prevention of damage to the light transmission region.

The window may have a wear rate that is the same as, or slightly higher than, the wear rate of the polishing layer. In such event, it is possible to prevent the problem that the window portion only is protruded after polishing is carried out for a certain period of time, whereby scratches are generated on the wafer to be polished.

The other side of the window (i.e., another side on which the second adhesive layer is not formed) is surface treated. The other side that is surface treated may have a surface roughness (Ra) of 2.0 to 4.0 µm.

The surface treatment is intended to prevent an error that may occur in detecting the termination point due to the wear of a window during a CMP process. The method of the surface treatment is not particularly limited as long as the surface roughness range can be satisfied. For example, the surface treatment may be carried out with sandpaper at a speed of 100 to 1,000 rpm and a pressure of 0.1 to 3.0 psi for 10 to 60 seconds.

When the thickness of the window is 2.3 to 2.5 mm, the light transmittance of the window may be 60 to 80% and the refractive index thereof may be 1.45 to 1.60. Specifically, when the thickness of the window is 2.4 mm, the light transmittance of the window may be 65 to 75% and the refractive index thereof may be 1.53 to 1.57.

Second Adhesive Layer

The second adhesive layer is formed on a side of the window. A part of the peripheral region of the second adhesive layer and the first adhesive layer are adhered to each other.

The second adhesive layer may be formed of a hot-melt adhesive having a melting point of 90 to 130° C. or 110 to 130° C. If the melting point of the second adhesive layer is within the above range, the adhesive force of the second adhesive layer is excellent, so that it is possible to prevent the window and the first adhesive layer from being delaminated from each other that may cause leakage in a CMP process.

The hot-melt adhesive is as described above with respect to the first adhesive layer.

The thickness of the second adhesive layer may be 20 to 50 µm, specifically 23 to 40 µm. If the thickness of the second adhesive layer is within the above range, it is possible to prevent leakage of a slurry at the window portion in a CMP process, and the second adhesive layer adheres to the lower side of the window to reduce the surface roughness of the window to thereby reduce the irregular reflection, which produces an effect of increasing the transmittance of the window.

When the thickness of the second adhesive layer is 20 to 50 µm, the light transmittance of the second adhesive layer may be 90 to 99% and the refractive index thereof may be 1.4 to 1.6. Specifically, when the thickness of the second adhesive layer is 30 to 40 µm, the light transmittance of the second adhesive layer may be 92 to 95% and the refractive index thereof may be 1.50 to 1.55.

If the light transmittance and the refractive index of the second adhesive layer are within the above ranges, it is possible to prevent the irregular reflection that may be caused by a rough surface of the lower side of the window.

When the ratio of the thickness of the window to that of the second adhesive layer is 100:1, the difference in the light transmittance between the window and the second adhesive layer may be 1 to 10%, and the difference in the refractive index between them may be 0.01 to 0.1. Specifically, when the ratio of the thickness of the window to that of the second adhesive layer is 100:1, the difference in the light transmittance between the window and the second adhesive layer may be 5 to 10%, and the difference in the refractive index between them may be 0.05 to 0.1.

The polishing pad may further comprise an adhesive tape on the other side of the support layer. In such event, the adhesive tape is adhered to the opposite side of the support layer on which the first adhesive layer is formed.

The adhesive tape may be a double-sided adhesive tape. The adhesive tape serves to adhere the polishing pad to a platen.

When the region of the polishing pad in which the first to third penetrating holes are formed is pressurized to a pressure of 1 to 5 kgf/cm$^2$ and the pressure is measured in 5 minutes, the change in the pressure after 5 minutes with respect to the pressure of the pressurization may be 35% or less. Specifically, the change in the pressure of the polishing pad after 5 minutes with respect to the pressure of the pressurization may be 10 to 35%.

If the change in the pressure is within the above range, it is possible to prevent leakage at the window portion in a CMP process.

When the region of the polishing pad in which the first to third penetrating holes are formed is depressurized to a pressure of 0.001 to 0.1 kgf/cm$^2$ and the pressure is measured in 5 minutes, the pressure after 5 minutes may be 1 kgf/cm$^2$ or less. Specifically, when the region of the polishing pad in which the first to third penetrating holes are formed is depressurized to a pressure of 0.001 to 0.1 kgf/cm$^2$ and the pressure is measured in 5 minutes, the pressure after 5 minutes may be 0.1 to 0.9 kgf/cm$^2$.

If the pressure after 5 minutes from the depressurization is within the above range, it is possible to prevent leakage at the window portion in a CMP process.

In addition, it can be confirmed that leakage does not occur in any of an actual CMP process by cross-checking the change in the pressure after the pressurization and the change in the pressure after the depressurization.

Process for Preparing a Polishing Pad

Another embodiment provides a process for preparing a polishing pad, which comprises (1) providing a polishing layer having a first penetrating hole formed therein;

(2) providing a support layer opposite to the polishing layer;

(3) interposing a first adhesive layer between the polishing layer and the support layer, and adhering the polishing layer and the support layer to each other with the first adhesive layer;

(4) forming a third penetrating hole passing through the first adhesive layer in a predetermined region of the first adhesive layer and a second penetrating hole passing through the support layer in a predetermined region of the support layer, based on the first penetrating hole; and (5) inserting a window having a second adhesive layer adhered to a side of the window into the first penetrating hole and adhering a part of the peripheral region of the second adhesive layer and the first adhesive layer.

Step (1)

In this step, a polishing layer having a first penetrating hole formed therein is provided.

The first penetrating hole passes through the polishing layer. The method of forming the first penetrating hole, which passes through the polishing layer, includes a method of pressing or grinding with a cutting tool, a method of using a laser such as a carbonic acid laser, a method of injecting a raw material into a mold having a shape conforming to the first penetrating hole and curing it, and the like, but it is not limited thereto.

The polishing layer is as described above with respect to the polishing pad.

Step (2)

In this step, a support layer opposite to the polishing layer is provided.

The support layer is as described above with respect to the polishing pad.

Step (3)

In this step, a first adhesive layer is interposed between the polishing layer and the support layer, and the polishing layer and the support layer are adhered to each other with the first adhesive layer.

The adhesion may be carried out at a temperature above the melting point of the first adhesive layer. Specifically, the adhesion may be carried out at 90 to 130° C.

Step (4)

In this step, a third penetrating hole passing through the first adhesive layer in a predetermined region of the first adhesive layer and a second penetrating hole passing through the support layer in a predetermined region of the support layer are formed based on the first penetrating hole.

The third penetrating hole is formed in the region in which the first penetrating hole is formed. The planar area of the third penetrating hole may be smaller than the planar area of the first penetrating hole.

The second penetrating hole is formed in the region in which the first penetrating hole is formed. The planar area of the second penetrating hole may be smaller than the planar area of the first penetrating hole.

The widths (or diameters) of the first penetrating hole to the third penetrating hole may have a relationship as described above with respect to the polishing pad.

The third penetrating hole and the second penetrating hole may be formed at the same time, so that the third penetrating hole and the second penetrating hole correspond to each other. If the third penetrating hole and the second penetrating hole are formed at the same time, the process is simple because it is capable of readily forming a light transmitting region at a predetermined position without forming a notch as compared with the conventional method in which a penetrating hole is formed in the polishing layer, in the first adhesive layer, and in the support layer, respectively, and then the layers are adhered to each other. In addition, if the third penetrating hole and the second penetrating hole are formed at the same time such that they correspond to each other, the first adhesive layer is not present in the light transmitting region, whereby it is possible to fabricate a polishing pad having excellent optical detection accuracy.

The third penetrating hole and the second penetrating hole may be formed by cutting them using a guide member. Specifically, this method may comprise inserting a guide member into the first penetrating hole; aligning a cutting member at a predetermined position by the guide member; and cutting a part of the first adhesive layer and a part of the support layer by the cutting member.

Referring to FIGS. 3 and 4, in order to form the third penetrating hole and the second penetrating hole, a guide member (301) to which a cutting member (303) has been fixed may be used, or a cutting member (304) may be guided by a guide member (302).

The cutting member may be fixed to the guide member or guided by the guide member. In addition, the guide member may be in contact with the inner side of the first penetrating hole to guide the cutting member. Further, the cutting member may cut the first adhesive layer and the support layer at the same time.

Step (5)

In this step, a window having a second adhesive layer adhered to a side of the window is inserted into the first penetrating hole, and a part of the peripheral region of the second adhesive layer and the first adhesive layer are adhered.

The window is as described above with respect to the polishing pad.

The adhesion may be carried out by a part or the entire of the first adhesive layer and the second adhesive layer being melt and adhered to each other. Specifically, the first adhesive layer and the second adhesive layer may be formed of a hot-melt adhesive having a melting point of 90 to 130° C. The adhesion may be carried out at 100 to 120° C.

The adhesion may utilize heat or vibration. Specifically, a heat melt-bonding method or an ultrasonic melt-bonding method may be used to adhere the first adhesive layer and the second adhesive layer.

Meanwhile, the process for preparing a polishing pad according to another embodiment may further comprise adhering an adhesive tape to a side of the support layer of the polishing pad to which the second adhesive layer and the first adhesive layer are adhered.

The adhesive tape serves to adhere the polishing pad prepared by the process as described above to a platen. It may be a double-sided adhesive tape. In addition, the adhesive tape may comprise a fourth penetrating hole that corresponds to the second and third penetrating holes.

MODE FOR THE INVENTION

Hereinafter, the present invention is explained in detail by the following Examples. However, these examples are set forth to illustrate the present invention, and the scope of the present invention is not limited thereto.

Example 1: Preparation of a Polishing Pad 1-1: Preparation of a Polishing Layer

In a casting machine equipped with feeding lines for a urethane-based prepolymer, a curing agent, an inert gas, and a reaction rate controlling agent, PUGL-450D (SKC) having an unreacted NCO content of 8.0% by weight was charged to the prepolymer tank, and bis(4-amino-3-chlorophenyl) methane (Ishihara) was charged to the curing agent tank. A1 (Air Product) as a reaction rate controlling agent and argon (Ar) as an inert gas were prepared.

The urethane-based prepolymer, the curing agent, the reaction rate controlling agent, and the inert gas were stirred while they were fed to the mixing head at constant rates through the respective feeding lines. In such event, the molar equivalent ratio of the NCO group in the urethane-based prepolymer to the reactive groups in the curing agent was adjusted to 1:1, and the total feeding amount was maintained at a rate of 10 kg/min. In addition, the reaction rate controlling agent was fed in an amount of 0.5 part by weight based on 100 parts by weight of the urethane-based prepolymer. The argon gas was fed in a volume of 20% based on the total volume of the urethane-based prepolymer. The mixed raw materials were injected into a mold (having a width of 1,000 mm, a length of 1,000 mm, and a height of 3 mm) and solidified to obtain a polishing layer in the form of a sheet.

Thereafter, the surface of the polishing layer was ground to adjust the average thickness to 2 mm.

1-2: Preparation of a Window

A window in the form of a cake was obtained in the same manner as in Example 1-1, except that PUGL-500D (SKC) having an unreacted NCO content of 8.5% by weight was used as a urethane-based prepolymer, that an inert gas was not fed in the mixing step of the raw materials, and that the mixed raw materials were injected into a mold (having a width of 1,000 mm, a length of 1,000 mm, and a height of 50 mm).

Then, the cake was cut and ground to produce twenty windows in the form of a sheet having an average thickness of 1.9 mm. The window in the form of a sheet was punched to obtain a window (refractive index: 1.55) having a width of 20 mm, a length of 60 mm, and a thickness of 1.9 mm.

Then, the window and sandpaper of 1,000-grit sandpaper were mounted on a grinder provided with a cushion layer. A side of the window was surface treated with the sandpaper at a rotation speed of 300 rpm and a pressure of 3.0 psi for 30 seconds to obtain a window having a surface roughness (Ra) of 2.07 μm.

Thereafter, a hot-melt film (manufacturer: SKC, product name: TF-00, average thickness: 40 μm, refractive index: 1.5) was laminated on the other side of the window, which was not surface treated, at 120° C. using a laminator.

1-3: Preparation of a Support Layer

A support layer (manufacturer: PTS, product name: ND-5400H, thickness: 1.1 mm) was cut to a width of 1,000 mm and a width of 1,000 mm.

1-4: Preparation of a Polishing Pad

The polishing layer of the above Example 1-1 was punched at a width of 20 mm and a length of 60 mm to form a first penetrating hole, and the support layer of the above Example 1-3 was punched at a width of 16 mm and a length of 56 mm to form a second penetrating hole. Then, the support layer and the polishing layer were laminated and melt-bonded at 120° C. and a gap of 1.5 mm with a hot-melt film (manufacturer: SKC, product name: TF-00, average thickness: 40 μm, refractive index: 1.5). A double-sided adhesive tape (manufacturer: 3M, product name: 442JS) was adhered to the other side of the support layer. The double-sided adhesive that corresponds to the second penetrating hole was cut and removed. Then, the window of the above Example 1-2 was inserted into the first penetrating hole with the surface-treated side thereof was exposed to the polishing layer. It was heat melt-bonded at 130° C. and 0.5 MPa for 3 minutes to prepare a polishing pad (see FIG. 2).

Example 2

A polishing pad was prepared in the same manner as in Example 1, except that the window was inserted and then heat melt-bonded at 130° C. and 0.6 MPa for 3 minutes.

Example 3

A polishing pad was prepared in the same manner as in Example 1, except that the window was inserted and then heat melt-bonded at 130° C. and 0.7 MPa for 3 minutes.

Comparative Example 1

A polishing pad was prepared in the same manner as in Example 1, except that a hot-melt film was not laminated on the other side of the window, which was not surface treated, and that the window was inserted and then heat melt-bonded at 100° C. and 0.5 MPa for 3 minutes.

Comparative Example 2

A polishing pad was prepared in the same manner as in Example 1, except that a hot-melt film was not laminated on the other side of the window, which was not surface treated, and that the window was inserted and then heat melt-bonded at 130° C. and 0.4 MPa for 3 minutes.

Comparative Example 3

A polishing pad was prepared in the same manner as in Example 1, except that a hot-melt film was not laminated on the other side of the window, which was not surface treated, and that the window was inserted and then heat melt-bonded at 100° C. and 0.7 MPa for 3 minutes.

Test Example: Non-Destructive Leakage Test (1) Non-Destructive Leakage Test Through Pressurization The window insertion portion of each of the polishing pads of Examples 1 to 3 and Comparative Examples 1 to 3 was placed on a support member. A gas tightness test apparatus equipped with a round connector having a diameter of 10 cm with a seal on the rim was placed in the portion where the second penetration hole was formed. Then, the pressure was increased to 3 kgf/cm$^2$ through the gas tightness testing apparatus, and the pressure was measured in 5 minutes. The results are shown in Table 1 below. The change in the pressure was calculated as the change in the pressure after 5 minutes as compared with the initial pressure of the pressurization.

(2) Non-Destructive Leakage Test Through Depressurization

The window insertion portion of each of the polishing pads of Examples 1 to 3 and Comparative Examples 1 to 3 was placed on a support member. A gas tightness test apparatus equipped with a round connector having a diameter of 10 cm with a seal on the rim was placed in the portion where the second penetration hole was formed. Then, the pressure was decreased to 0.01 kgf/cm$^2$ through the gas tightness testing apparatus, and the pressure was measured in 5 minutes. The results are shown in Table 1 below. The change in the pressure was calculated as the change in the pressure after 5 minutes as compared with the initial pressure of depressurization.

(3) Destructive Leakage Test

The polishing pads of Examples 1 to 3 and Comparative Examples 1 to 3 were each subjected to a CMP process for 20 hours. If water droplets were formed on the non-polished surface of the polishing pad, or if the support layer was wet, it was determined as leakage.

TABLE 1

| | | C. Ex. 1 | C. Ex. 2 | C. Ex. 3 | Ex. 1 | Ex. 2 | Ex. 3 |
|---|---|---|---|---|---|---|---|
| Pressurization test | Pressure after 5 minutes from pressurization (kgf/cm$^2$) | 1.35 | 1.73 | 1.81 | 2.08 | 2.45 | 2.35 |
| | Change in pressure | 55% | 42.3% | 39.6% | 30.6% | 18.3% | 21.6% |
| Depressurization test | Pressure after 5 minutes from depressurization (kgf/cm$^2$) | 1.0 | 1.0 | 1.0 | 0.8 | 0.6 | 0.6 |
| | Change in pressure | 9.900% | 9.900% | 9.900% | 7.900% | 7.900% | 7.900% |
| Destructive test | | X | X | X | O | O | O |

As confirmed from Table 1, the polishing pads of Examples 1 to 3, which comprised a second adhesive layer, had a low level of leakage by virtue of low changes in the pressure after the pressurization and the depressurization. It was also confirmed that the level of leakage was low even in the destructive test after the CMP process. In contrast, the polishing pads of Comparative Examples 1 to 3 had high changes in the pressure after the pressurization and the depressurization. Leakage was also observed in the destructive test after the CMP process.

| Reference Numeral of the Drawings | |
|---|---|
| 101: polishing layer | 102: support layer |
| 103: first adhesive layer | 104: window |
| 105: second adhesive layer | 201: first penetrating hole |
| 202: second penetrating hole | 203: third penetrating hole |
| 301, 302: guide member | 303, 304: cutting member |

The invention claimed is:

1. A polishing pad, which comprises:
a polishing layer having a first penetrating hole formed therein;
a support layer having a second penetrating hole formed in the region in which the first penetrating hole is formed;
a first adhesive layer interposed between the polishing layer and the support layer and having a third penetrating hole formed in the region in which the first penetrating hole is formed; and
a window inserted in the first penetrating hole and having a second adhesive layer adhered to a side of the window,
wherein the second penetrating hole and the third penetrating hole are aligned with each other, and
a part of the peripheral region of the second adhesive layer is adhered to the first adhesive layer,
wherein the light transmittance of the window is 60 to 80% and the refractive index thereof is 1.45 to 1.60, and
wherein the thickness of the second adhesive layer is 20 to 50 μm, the light transmittance of the second adhesive layer is 90 to 99% and the refractive index thereof is 1.4 to 1.6.

2. The polishing pad of claim 1, wherein, when the ratio of the thickness of the window to the thickness of the second adhesive layer is 100:1, the difference in the light transmittance between the window and the second adhesive layer is 1 to 10%, and the difference in the refractive index between them is 0.01 to 0.1.

3. The polishing pad of claim 1, wherein the first adhesive layer and the second adhesive layer are formed of a hot-melt adhesive having a melting point of 90 to 130° C.

4. The polishing pad of claim 1, wherein the other side of the window is surface treated, and the surface-treated side has a surface roughness (Ra) of 2.0 to 4.0 μm.

5. A process for preparing a polishing pad, which comprises:
(1) providing a polishing layer having a first penetrating hole formed therein;
(2) providing a support layer opposite to the polishing layer;
(3) interposing a first adhesive layer between the polishing layer and the support layer, and adhering the polishing layer and the support layer to each other with the first adhesive layer;
(4) forming a third penetrating hole passing through the first adhesive layer in a predetermined region of the first adhesive layer and a second penetrating hole passing through the support layer in a predetermined region of the support layer, based on the first penetrating hole; and
(5) inserting a window having a second adhesive layer adhered to a side of the window into the first penetrating hole and adhering a part of the peripheral region of the second adhesive layer and the first adhesive layer,
wherein the light transmittance of the window is 60 to 80% and the refractive index thereof is 1.45 to 1.60, and
wherein the thickness of the second adhesive layer is 20 to 50 μm, the light transmittance of the second adhesive layer is 90 to 99% and the refractive index thereof is 1.4 to 1.6.

6. The process for preparing a polishing pad of claim 5, wherein the third penetrating hole is formed in the region in which the first penetrating hole is formed,
the planar area of the third penetrating hole is smaller than the planar area of the first penetrating hole,
the second penetrating hole is formed in the region in which the first penetrating hole is formed, and
the planar area of the second penetrating hole is smaller than the planar area of the first penetrating hole.

7. The process for preparing a polishing pad of claim 5, wherein the second penetrating hole and the third penetrating hole are formed, so that the second penetrating hole and the third penetrating hole correspond to each other.

8. The process for preparing a polishing pad of claim 5, wherein the adhesion in the above step (5) of claim 5 is carried out by a part or the entire of each of the first adhesive layer and the second adhesive layer being melted and adhered to each other.

9. The process for preparing a polishing pad of claim 8, wherein the first adhesive layer and the second adhesive layer are formed of a hot-melt adhesive having a melting point of 90 to 130° C., and the adhesion in the above step (5) is carried out at 100 to 120° C.

\* \* \* \* \*